United States Patent

Wong

Patent Number: 5,512,849
Date of Patent: Apr. 30, 1996

[54] LOW POWER INTELLIGENT CURRENT SOURCE FOR MONITORING A HIGH VOLTAGE

[75] Inventor: Stephen L. Wong, Scarsdale, N.Y.

[73] Assignee: North American Philips Corporation, New York, N.Y.

[21] Appl. No.: 308,468

[22] Filed: Sep. 19, 1994

Related U.S. Application Data

[63] Continuation of Ser. No. 55,651, Apr. 30, 1993, abandoned.

[51] Int. Cl.$^6$ ........................................... H03K 5/24
[52] U.S. Cl. .................... 327/77; 327/78; 327/80
[58] Field of Search ........................ 307/362, 350, 307/494, 354, 358; 327/58, 60, 62, 63, 66, 68, 70, 72, 74, 76, 77–81, 315

[56] References Cited

U.S. PATENT DOCUMENTS

| | | | |
|---|---|---|---|
| 4,249,095 | 2/1981 | Hsu | 307/350 |
| 4,318,013 | 3/1982 | Thomas et al. | 307/362 |
| 4,463,271 | 7/1984 | Gill, Jr. | 307/350 |
| 4,528,869 | 5/1985 | Herold | 307/350 |
| 4,553,084 | 11/1985 | Wrathall | 330/257 |
| 4,580,069 | 4/1986 | Bynum | 307/350 |
| 4,603,267 | 7/1986 | Kowallek | 307/362 |
| 4,659,944 | 4/1987 | Miller, Sr. et al. | 307/350 |
| 4,697,097 | 9/1987 | Rusznyak | 307/350 |
| 4,749,880 | 6/1988 | Kobatake | 307/350 |
| 5,111,071 | 5/1992 | Kwan et al. | 307/350 |
| 5,113,089 | 5/1992 | Osawa | 307/350 |
| 5,136,184 | 8/1992 | Deevy | 307/362 |
| 5,144,173 | 9/1992 | Hui | 307/494 |
| 5,187,387 | 2/1993 | Kawauchi | 307/350 |
| 5,187,389 | 2/1993 | Hall et al. | 307/350 |
| 5,187,396 | 2/1993 | Armstrong et al. | 307/494 |

FOREIGN PATENT DOCUMENTS

| | | |
|---|---|---|
| 0093606 | 8/1985 | European Pat. Off. . |
| 0174736 | 3/1986 | European Pat. Off. . |
| 2030398 | 4/1980 | United Kingdom . |
| 9012324 | 10/1990 | WIPO . |

OTHER PUBLICATIONS

Search Report.

*Primary Examiner*—Timothy P. Callahan
*Assistant Examiner*—T. Lam
*Attorney, Agent, or Firm*—Bernard Franzblau

[57] ABSTRACT

A low power integrated current source (ICS) for monitoring the voltage at an input terminal includes a current source and a network of current mirror circuits coupled to the current source, to the input terminal and to an output terminal. The circuit monitors the input voltage by comparing the input current with a reference current determined by the current source. The current mirror network responds to a predetermined voltage (current) at the input terminal to switch the output voltage at the output terminal from a first voltage level to a second voltage level. The ICS voltage monitor circuit limits the maximum value of the input current as the input voltage increases beyond a given voltage level thereby limiting the power dissipation. The trip voltage can be reset by merely changing the reference current supplied by the current source or by changing the value of an input resistor whose purpose is to convert the input voltage into an input current.

19 Claims, 1 Drawing Sheet

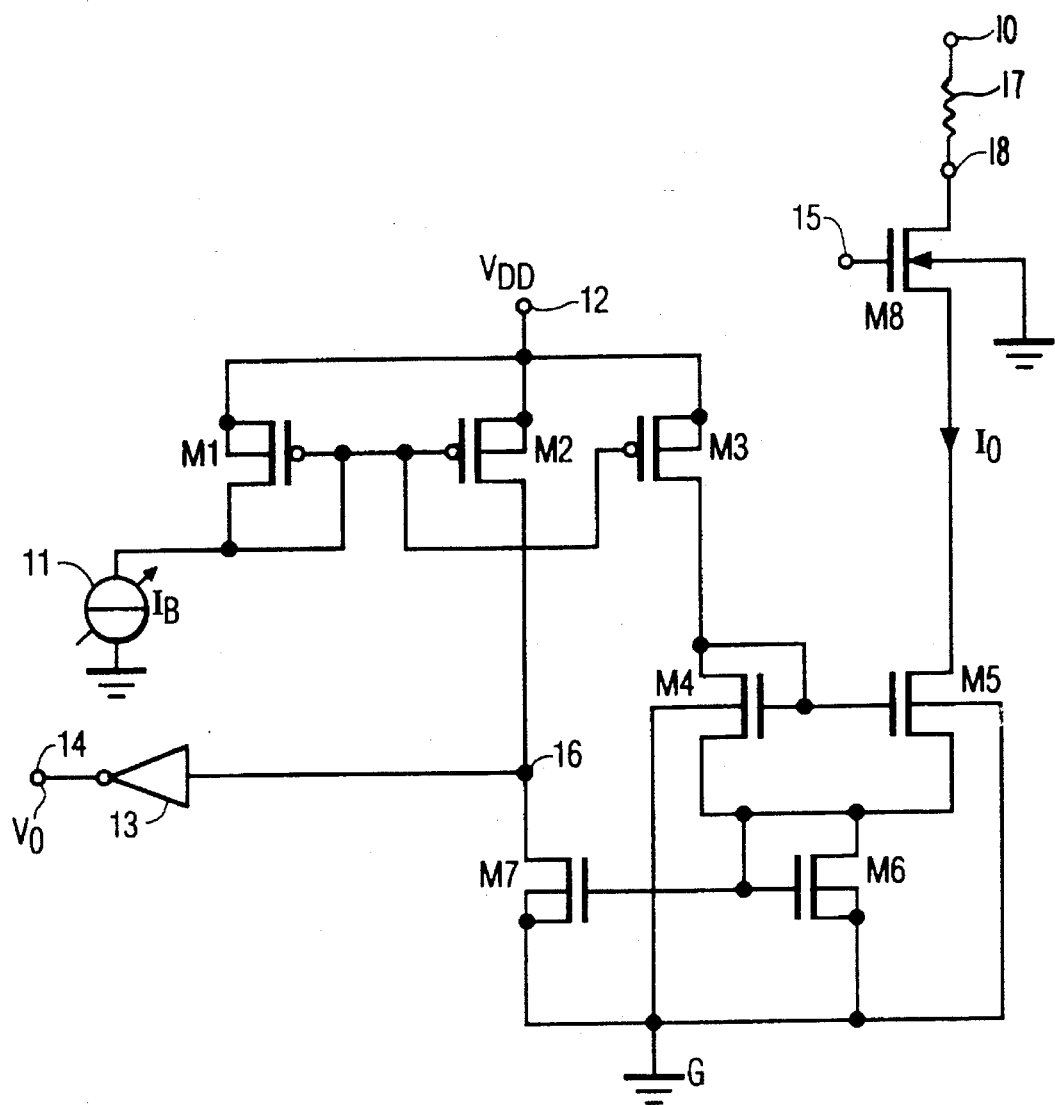

5,512,849

LOW POWER INTELLIGENT CURRENT SOURCE FOR MONITORING A HIGH VOLTAGE

This is a continuation of application Ser. No. 08/055,651, filed Apr. 30, 1993, now abandoned.

BACKGROUND OF THE INVENTION

The present invention relates to a circuit for monitoring a high voltage and, more particularly, to a voltage level detection circuit that has the ability to limit the input current to a predetermined value and thereby limit the power dissipated despite an increase of the high voltage being monitored.

There are a wide variety of circuits available to monitor or detect the level of an input voltage. Many of these conventional voltage level detection circuits use a resistor voltage divider as a basic building block. The voltage detection circuit compares the voltages at nodes along the voltage divider against a reference voltage that can be derived by means of a transistor chain.

This type of voltage detection circuit is subject to various limitations, one of which is the relatively high level of power dissipated in the resistive voltage divider. This power is wasted and thus reduces the overall efficiency of the voltage detection circuit. Another disadvantage of the resistor voltage divider type detection circuit is that the current dissipated will increase with the level of the input voltage being monitored.

A voltage level detection circuit of this type is described in the U.K. Patent Application, GB 2030398A in the name of Musa et al. This published patent application utilizes a constant voltage reference generator consisting of three field effect transistors connected in series across the terminals of a DC voltage supply whose voltage level is to be monitored. The voltage reference generator provides a constant output voltage which does not vary with variations of the monitored power supply voltage. A resistor voltage divider is also connected across the terminals of the DC power supply voltage. Three comparator circuits each have one input connected to the output of the voltage reference generator and second inputs connected to respective nodes along the resistor voltage divider. The voltages at these nodes vary with the level of the DC supply voltage. The comparators produce control voltage signals when the voltages sensed by the resistor voltage divider reach predetermined levels. This voltage protection circuit is subject to the disadvantages enumerated above, i.e. excessive current and power dissipation which increases as the monitored input voltage increases. In addition, the trip point voltage of the detection circuit is difficult to control.

SUMMARY OF THE INVENTION

It is therefore an object of the present invention to provide a high voltage monitor circuit that avoids the aforesaid disadvantages of the conventional resistor voltage divider type voltage level detection circuits which are currently in widespread use.

Another object of the invention is to provide an on-chip voltage level monitor circuit suitable for use in a wide variety of monolithic integrated circuits.

Yet another object of the present invention is to provide an intelligent current source for monitoring a high voltage and which operates as a current comparator, yet has the ability to limit the input current from the monitored voltage to a predetermined value.

A further object of the invention is to provide a high voltage sensor circuit that operates both as a current source and as a current sensor.

A still further object of the invention is to provide a voltage monitor circuit that uses a current comparison technique to set the trip point for the circuit.

Another object of the invention is to provide a voltage monitor circuit in which the trip voltage can be adjustably set by changing the value of a current reference.

According to the invention, a low power intelligent current source (ICS) circuit for monitoring an input voltage at an input terminal comprises a plurality of current mirror circuits interconnected to a current source and to the input terminal such that a predetermined voltage (current) change at the input terminal produces a readjustment of the currents flowing in the current mirror circuits so that the voltage at a voltage output terminal of the voltage monitor circuit switches state, i.e. from a high voltage to a low voltage or vice versa. The use of a current source in combination with the current mirror circuits limits the maximum value of the input current drawn from the monitored input terminal thereby limiting the power dissipated in the circuit.

The voltage monitor circuit operates as a current comparator but is still able to limit the input current to a predetermined value. The circuit is therefore ideally suited to implement a low power, high voltage sensor because it prevents the input current (also power) from increasing with an increase of the monitored input voltage. The circuit provides a dual function, i.e. as a current source and as a current sensor. This dual function aspect of the invention makes it possible to use the current sensor as a very high voltage sensor, by means of an input resistor, but without drawing an excessive input current which would otherwise dissipate too much power in an integrated circuit. The circuit can also be used as a current sensor without the resistor.

The output of the voltage monitor circuit changes state when the input voltage exceeds a predetermined voltage level. The circuit uses a current comparison mode of operation rather than transistor thresholds in order to set the voltage trip point of the circuit. The circuit bias current does not increase with the input voltage thereby limiting the power dissipation. The level of the trip voltage can be easily set by changing the value of the reference current or the value of the input resistor. The circuit also will operate without the input resistor.

BRIEF DESCRIPTION OF THE DRAWING

The foregoing and other object and advantages of the present invention will be better understood from a consideration of the following detailed description of the invention when taken in conjunction with the accompanying drawing, the sole figure of which shows an intelligent current source for monitoring an input voltage.

DESCRIPTION OF THE PREFERRED EMBODIMENTS

The drawing shows the intelligent current source for monitoring a high voltage applied to an input terminal 10 of the monitor circuit. A constant current source 11 has one terminal connected to a point of reference voltage, in this case ground, and has a second terminal connected to an input terminal of a first current mirror circuit consisting of three field effect transistors M1, M2 and M3. The current ratio for these transistors is 1:1:1. Therefore, since the current source 11 provides a current $I_B$, a current $I_B$ also flows through each of the field effect transistors M1, M2 and M3 of the first current mirror circuit.

The gate electrodes of the field effect transistors M1, M2 and M3 are all connected together and the gate electrode of field effect transistor M1 is connected to its one main electrode which is connected in turn to the current source 11. The other main electrodes of the field effect transistors M1, M2 and M3 are all connected in common to a terminal 12 which receives a DC supply voltage, $V_{DD}$, for operation of the ICS voltage monitor circuit. The DC supply voltage terminal $V_{DD}$ is also coupled to current mirror circuits M6–M7 and M4–M5 via transistors M2 and M3 of the current mirror circuit M1–M2–M3.

The main electrode of the field effect transistor M2 that is remote from the voltage supply terminal 12 constitutes a first output terminal of the current mirror circuit M1, M2 and M3 and is coupled directly to a first main electrode of a field effect transistor M7, which is the output of a current mirror M6, M7, and to an input of an inverter circuit 13. The output of the inverter circuit is connected to the output terminal 14 of the ICS voltage monitor circuit.

A second main electrode of the field effect transistor M7 is connected to the point of reference voltage (ground). The field effect transistor M7 forms a second current mirror circuit with the field effect transistor M6. Thus, the gate electrode of field effect transistor M7 is directly connected to the gate electrode of field effect transistor M6 which is also directly connected to one of its main electrodes. Transistor M6 thus is connected as a diode and is the input branch of the current mirror M6, M7. The other main electrode of FET M6 also is connected to the reference voltage, ground. The current ratio between field effect transistors M7 and M6 is chosen to be 1:3, that is field effect transistor M6 will carry three times the current of field effect transistor M7.

A second output terminal of the first current mirror circuit M1, M2, M3, that is the main electrode of field effect transistor M3 remote from the voltage supply terminal 12, is connected directly to a first input terminal of a third current mirror circuit made up of field effect transistor M4 and field effect transistor M5. A first main electrode of field effect transistor M4 constitutes the first input terminal of the third current mirror circuit which is in turn directly connected to its gate electrode so that field effect transistor M4 functions as a diode. Transistors M4–M7 are all of the same conductivity type.

The gate electrode of FET M4 is directly connected to the gate electrode of FET M5. A first main electrode of field effect transistor M5 constitutes the output of current mirror M4, M5 and is directly connected to a first main electrode of a field effect transistor M8 operating as a buffer stage for the voltage monitor circuit. The buffer transistor M8 is only needed if the input voltage is a high voltage. In that case, a resistor 17 is preferably connected between an input current terminal 18 and the input voltage terminal 10. The second main electrodes of field effect transistors M4 and M5 are connected in common to the first main electrode of the field effect transistor M6 of the second current mirror circuit. The current ratio of the FET M4 to the FET M5 is chosen to be 1:5. MOS field effect transistors M4 and M5 each have a so-called back-gate electrode connected to ground. The current ratios given for the various current mirror circuits can be changed to satisfy different functional requirements of the voltage monitor circuit.

The buffer field effect transistor M8 has a second main electrode connected to the voltage input terminal 10 either directly or via the resistor 17 and has a gate electrode connected to a bias voltage input terminal 15. The bias voltage may be derived from the DC supply voltage $V_{DD}$.

The voltage to be monitored is applied to input terminal 10. As an example, the present voltage monitor circuit can be used to monitor the drain-source voltage of the series connected control transistor of the low power pre-regulator power supply circuit of the copending U.S. application of S. Wong and N. Majid Ser. No. 08/055,655 (Apr. 30, 1995), now U.S. Pat. No. 5,469,046. In that circuit, it is desired to provide a control signal indication when the drain-source voltage of the control transistor drops below 60 volts. Under normal conditions, each of the field effect transistors M1, M2 and M3 of the first current mirror circuit M1–M3 will carry a current $I_B$ equal to the current ($I_B$) supplied by the current source 11. A current $I_B$ will therefore flow through field effect transistor M4 of the current mirror circuit M4, M5 and due to the current ratio of 1:5, a current of 5 $I_B$ will flow through FET M5 and also through the cascode buffer FET M8.

As a result of the current $I_B$ in field effect transistor M4 and the current 5 $I_B$ in field effect transistor M5, a current of 6 $I_B$ flows through field effect transistor M6 connected to field effect transistors M4 and M5. The 1:3 current ratio of field effect transistors M7 and M6 of the second current mirror circuit M6, M7 causes a current of 2 $I_B$ to flow through FET M7. Since FET M2 only supplies a current equal to $I_B$, the voltage $V_{16}$ at the junction point 16 goes low and the output voltage, $V_O$, at output terminal 14 goes high.

If the voltage at the input terminal 10 drops below a given level, for example, 60 volts in the example mentioned above, it can be arranged that the current $I_0$ flowing through buffer transistor M8 drops below 2 $I_B$. As a result of the current $I_B$ already flowing through field effect transistor M4, a current less than 3 $I_B$ will flow through field effect transistor M6 and hence a current less than $I_B$ will flow through field effect transistor M7 in view of the 1:3 current ratio of FET M7 to FET M6. But a current equal to $I_B$ would try to flow through field effect transistor M2 and, as a result, the voltage $V_{16}$ will go high and the output voltage $V_O$ will go low, signalling the occurrence of the monitored condition.

The use of the inverter circuit 13 is of course optional. For example, if the output terminal 14 was directly connected to the junction point 16, then if the input voltage at terminal 10 is high enough, both transistors M4 and M5 will be in saturation and, assuming $I_B$ is 100 μA in the given example, will cause a current of 600 μA to flow in field effect transistor M6, i.e. 500 μA from FT M5 and 100 μA from FT M4. In view of the 3:1 current ratio of transistor M6 to transistor M7, a current of 200 μA will flow in transistor M7. Since field effect transistor M2 is biased to supply only 100 μA, the output terminal 14 (16) will be pulled low.

If the monitored voltage at terminal 10 drops to a value (e.g. 60 V) such that the current in transistor M5 is reduced from 500 μA to less than 200 μA, FET M7 will now carry a current less than 100 μA, which in turn will cause the output terminal 14 (16) to go high. In order to implement the circuit to monitor the drain-source voltage of a transistor, a 300 kΩ resistor can be connected between the drain voltage and the voltage input terminal 10. The cascade buffer transistor M8 can then be a high voltage LDMOS transistor with its gate connected to the on-chip DC bias voltage supply, for example, 12 volts. If the monitored drain voltage drops below 60 volts, i.e. 200 μA×300 kΩ=60 V, then the output voltage $V_O$ will go high to signal the occurrence of the monitored condition at input terminal 10. When the voltage at terminal 10 drops below 60 V, the input current decreases approximately linearly with the input voltage and the M4/M5 ratio does not influence the value of the input current.

Thus, it can be seen that an input voltage is effectively monitored by a comparison of an input current proportional thereto with a reference current via a novel circuit of current mirrors. The use of the current mirrors limits the maximum current $I_0$ that will flow in the case of an increase in the monitored voltage at voltage input terminal 10 above a predetermined voltage level. The current mirror network monitors the input voltage so that a predetermined voltage (current) change at the input terminal causes a readjustment of the currents flowing in the current mirror circuits so that the output voltage, $V_O$ can switch states to indicate a given voltage condition. The value (i.e. voltage level) of the trip voltage can be adjusted or reset by changing the value of current from the reference current source 11. The bias current source 11 may therefore be adjustable. The bias current in the circuit does not increase with an increase in the input voltage, thereby limiting the circuit power dissipation. The circuit acts as a current comparator which has the ability to limit the input current to a given value (i.e. 5 $I_B$ in the example chosen). The intelligent current source described can be used as a low power high voltage sensor.

It will of course be apparent that the values given for the current ratios of the current mirror circuits are by way of example only. Furthermore, various modifications and changes can be made in the invention described without departing from the true spirit and scope thereof, which is to be limited only to the extent required by the appended claims.

What is claimed is:

1. A voltage monitor circuit comprising:
   an input voltage terminal for receiving a voltage to be monitored and through which an input current flows,
   an output terminal at which a voltage is derived indicative of the voltage to be monitored,
   a current source,
   a first current mirror means coupled to the current source for comparing a current derived from the current source with said input current that flows through the input terminal thereby to derive at its output a voltage indicative of the monitored voltage,
   a second current mirror means coupled to the input terminal so as to limit said input current to a value determined by said current source,
   a DC supply voltage terminal coupled to the first and second current mirror means to supply a DC operating voltage thereto independent of said current source, and
   means coupling said output terminal to said output of the first current mirror means.

2. A voltage monitor circuit as claimed in claim 1 wherein said first current mirror means has a first terminal coupled to said current source, a second terminal coupled to said output terminal and a common terminal coupled to said DC supply voltage terminal, and the second current mirror means has a first terminal coupled to said input terminal and a second terminal coupled to a third terminal of the first current mirror means, and
   a third current mirror means having a first terminal coupled to the second terminal of the first current mirror means and a second terminal coupled to a common terminal of the second current mirror means such that all of a current flowing through the common terminal flows through the second terminal of the third current mirror means.

3. A voltage monitor circuit comprising:
   an input terminal for receiving a voltage to be monitored and through which an input current flows,
   an output terminal at which a voltage is derived indicative of the voltage to be monitored,
   a current source,
   a current mirror comparison means coupled to the current source for comparing a current derived from the current source with said input current that flows through the input terminal thereby to derive at its output a voltage indicative of the monitored voltage,
   wherein said current mirror comparison means further comprises,
   a first current mirror circuit having a first terminal coupled to said current source, a second terminal coupled to said output terminal, a second current mirror circuit having a first terminal coupled to said input terminal and a second terminal coupled to a third terminal of the first current mirror circuit, and a third current mirror circuit having a first terminal coupled to the second terminal of the first current mirror circuit and a second terminal coupled to a common terminal of the second current mirror circuit such that a current flowing through the common terminal also flows through the second terminal of the third current mirror circuit, and
   means coupling said output terminal to said output of the current mirror comparison means.

4. A voltage monitor circuit as claimed in claim 3 wherein;
   the first current mirror circuit comprises first, second and third branches comprising a first transistor connected as a diode a second transistor and a third transistor, respectively, said first, second and third branches being connected to said first, second and third terminals, respectively, of the first current mirror circuit,
   the second current mirror circuit comprises first and second branches comprising a fourth transistor and a fifth transistor connected as a diode, respectively, and with said first and second branches connected to said first and second terminals, respectively, of the second current mirror circuit, and
   the third current mirror circuit comprises first and second branches comprising a sixth transistor and a seventh transistor connected as a diode, respectively, and with said first and second branches connected to said first and second terminals, respectively, of the third current mirror circuit.

5. A voltage monitor circuit as claimed in claim 4 wherein each of said transistors comprise a field effect transistor.

6. A voltage monitor circuit as claimed in claim 4 wherein;
   the current ratio of said first, second and third branches of the first current mirror circuit is 1:1:1,
   the current ratio of said first and second branches of the second current mirror circuit is 5:1, and
   the current ratio of said first and second branches of the third current mirror circuit is 1:3.

7. A voltage monitor circuit as claimed in claim 1 further comprising:
   an input current terminal for said input current, a resistor coupled between said input voltage terminal and said input current terminal for converting the voltage to be monitored into said input current, and wherein the output voltage at said output terminal swings between said DC operating voltage and ground potential.

8. A voltage monitor circuit as claimed in claim 1 wherein the output voltage at said output terminal is abruptly triggered from a first voltage level to a second voltage level at a predetermined voltage at said input terminal and the current supplied by said current source is adjustable so as to adjust the level of the predetermined input voltage which triggers the output voltage from the first level to the second level.

9. A voltage monitor circuit as claimed in claim 1 wherein the output voltage at said output terminal is abruptly triggered from a first voltage level to a second voltage level at a predetermined voltage at said input terminal, and said second current mirror mean is coupled to said current source said first current mirror means and to said input terminal in a manner such that said input current is limited to a maximum value despite an increase in the level of the input voltage beyond said predetermined voltage.

10. A voltage monitor circuit as claimed in claim 7 further comprising an input high voltage transistor having its drain-source path serially connected between said input terminal and a terminal of the second current mirror means and with its gate electrode coupled to a source of bias voltage.

11. A voltage monitor circuit comprising:

an input terminal for receiving a voltage to be monitored, said input terminal being coupled to the voltage monitor circuit via a current path that does not include a control electrode of a transistor, an output terminal at which a voltage is derived indicative of the voltage to be monitored, a current source, a current mirror comparison means coupled to the current source and to said input terminal for limiting an input current that flows through said input terminal to a value determined by said current source and for comparing a current derived from the current source with said input current thereby to derive at its output a voltage indicative of the monitored voltage, a DC supply voltage terminal coupled to the current mirror comparison means to supply a DC operating voltage thereto independent of said current source, and means coupling said output terminal to said output of the current mirror comparison means.

12. A voltage monitor circuit as claimed in claim 11 wherein said current mirror comparison means comprises;

a first current mirror circuit having first, second and third current branches, a second current mirror circuit having first and second current branches, a third current mirror circuit having first and second current branches, wherein said first branch of the first current mirror circuit is connected in series with said current source to first and second supply voltage terminals for the voltage monitor circuit, said second branch of the first current mirror circuit is coupled in series with the first branch of the third current mirror circuit to said first and second supply voltage terminals, and said third branch of the first current mirror circuit is connected in series with the second branch of the second current mirror circuit and the second branch of the third current mirror circuit to said first and second supply voltage terminals, and the first branch of the second current mirror circuit is coupled in series with the second branch of the third current mirror circuit to said input terminal and to said second supply voltage terminal, and said coupling means couples the output terminal to a node between the second branch of the first current mirror circuit and the first branch of the third current mirror circuit.

13. A voltage monitor circuit as claimed in claim 11 wherein said current mirror comparison means comprises;

a first current mirror circuit coupled to said current source and to said output terminal, a second current mirror circuit coupled to said input terminal and to said first current mirror circuit, and a third current mirror circuit having a first branch coupled to said output terminal and a second branch connected in series with a first branch of the second current mirror circuit and in series with a second branch of the second current mirror circuit.

14. A voltage monitor circuit as claimed in claim 13 wherein the first current mirror circuit comprises a branch coupled in series circuit with the second branch of the second current mirror circuit and the second branch of the third current mirror circuit.

15. A voltage monitor circuit as claimed in claim 11 further comprising a resistor and an input transistor having a gate electrode and a drain-source path, wherein said resistor is coupled between the input terminal and the drain-source path of the input transistor whose gate electrode is coupled to a source of reference voltage.

16. A voltage monitor circuit as claimed in claim 1 wherein said first current mirror means comprises an input branch connected in series circuit with an output branch of the second current mirror means to said input voltage terminal, said second current mirror means includes an input branch coupled to said current source, and said first current mirror means includes an output branch coupled to said output terminal.

17. A voltage monitor circuit as claimed in claim 1, wherein said first and second current mirror means are coupled together and to said current source and said input terminal such that currents flowing in first and second branches of the second current mirror means flow in common through a single branch of the first current mirror means.

18. A voltage monitor circuit comprising:

an input voltage terminal for receiving a voltage to be monitored and through which an input current flows, an output terminal at which a voltage is derived indicative of the voltage to be monitored, a current source, a current mirror comparison means comprising;

a first transistor current mirror means having an output coupled to the current source for comparing a current derived from the current source with a current derived from said input current that flows through the input terminal thereby to derive at its output a voltage indicative of the monitored voltage, a second transistor current mirror means comprising transistors of the same transistor conductivity type as those of said first transistor current mirror means, and having an output coupled to the input terminal and having an input which receives a current derived from said current source whereby said input current is limited to a value determined by said current source, and means coupling said output terminal to said output of the first transistor current mirror means.

19. A voltage monitor circuit as claimed in claim 18 further comprising a third transistor current mirror means having a first branch connected in series circuit with said current source to a source of a DC operating voltage for the circuit and having a second branch coupled to said DC operating voltage and to said output of the first transistor current mirror means.

* * * * *